United States Patent
Milroy et al.

(10) Patent No.: US 10,819,306 B2
(45) Date of Patent: Oct. 27, 2020

(54) LOSSLESS LOBING CIRCUIT FOR MULTI-SUBARRAY TRACKING

(71) Applicant: ThinKom Solutions, Inc., Hawthorne, CA (US)

(72) Inventors: William Milroy, Torrance, CA (US); Eugene Yum, Los Angeles, CA (US)

(73) Assignee: ThinKom Solutions, Inc., Hawthorne, CA (US)

( * ) Notice: Subject to any disclaimer, the term of this patent is extended or adjusted under 35 U.S.C. 154(b) by 224 days.

(21) Appl. No.: 16/169,110

(22) Filed: Oct. 24, 2018

(65) Prior Publication Data
US 2020/0136582 A1 Apr. 30, 2020

(51) Int. Cl.
*H01Q 3/22* (2006.01)
*H03H 7/40* (2006.01)
(Continued)

(52) U.S. Cl.
CPC ............ *H03H 7/40* (2013.01); *H03F 1/56* (2013.01); *H03F 3/608* (2013.01); *H03H 7/21* (2013.01); *H03H 7/25* (2013.01); *H04B 1/0458* (2013.01)

(58) Field of Classification Search
CPC .. H01Q 3/22; H01Q 3/42; H01Q 3/34; H01Q 25/00; G01S 1/02; H04B 1/0458; H03H 7/40; H03H 7/21; H03H 7/25; H03F 1/56
(Continued)

(56) References Cited

U.S. PATENT DOCUMENTS 4,544,927 A * 10/1985 Kurth .................. H01Q 3/26
                                          342/371
5,717,405 A *  2/1998 Quan .................. H01Q 3/22
                                          333/117
(Continued)

FOREIGN PATENT DOCUMENTS

EP    2685557 A2     1/2014
EP    3567677 A1 * 11/2019    ......... H01Q 21/0068

OTHER PUBLICATIONS

European Search Report issued in connection with European Patent Application No. 19203274.6, dated Mar. 6, 2020.

*Primary Examiner* — Harry K Liu
(74) *Attorney, Agent, or Firm* — Kusner & Jaffe

(57) ABSTRACT

A multiport microwave device includes a first reactive three-port microwave device, a second reactive three-port microwave device, a third reactive three-port microwave device, and a matched four-port microwave device. The four-port microwave device includes first and second input ports and first and second output ports communicatively coupled to one another. A first port of each of the first, second and third three-port microwave devices is operative to receive a microwave signal, and a first output port and a second output port of the four-port microwave device are each operative to output a microwave signal. A second port of the first microwave device is communicatively coupled to a second port of the second microwave device, a second port of the third microwave device is communicatively coupled to a third port of the second microwave device, and a third port of the first microwave device is communicatively coupled to the first input port the four-port microwave device. A third port of the third microwave device is communicatively coupled to the second input port of the four-port microwave device.

18 Claims, 8 Drawing Sheets

(51) Int. Cl.
  *H03F 1/56*   (2006.01)
  *H03F 3/60*   (2006.01)
  *H03H 7/21*   (2006.01)
  *H03H 7/25*   (2006.01)
  *H04B 1/04*   (2006.01)

(58) Field of Classification Search
  USPC .......................................................... 342/371
  See application file for complete search history.

(56) References Cited

U.S. PATENT DOCUMENTS

| | | | |
|---|---|---|---|
| 6,268,828 B1 * | 7/2001 | Martek | H01Q 3/242 |
| | | | 342/373 |
| 2007/0096982 A1 * | 5/2007 | Kalian | H01Q 3/26 |
| | | | 342/377 |
| 2008/0291087 A1 * | 11/2008 | Tietjen | H01Q 21/065 |
| | | | 342/372 |
| 2014/0203960 A1 | 7/2014 | Huang et al. | |
| 2015/0372656 A1 * | 12/2015 | Mow | H04B 17/29 |
| | | | 455/77 |
| 2018/0219287 A1 * | 8/2018 | Lyu | H01Q 21/06 |
| 2018/0348592 A1 * | 12/2018 | Hosseini | G01S 17/02 |
| 2019/0312327 A1 * | 10/2019 | Kitt | H01P 5/08 |

\* cited by examiner

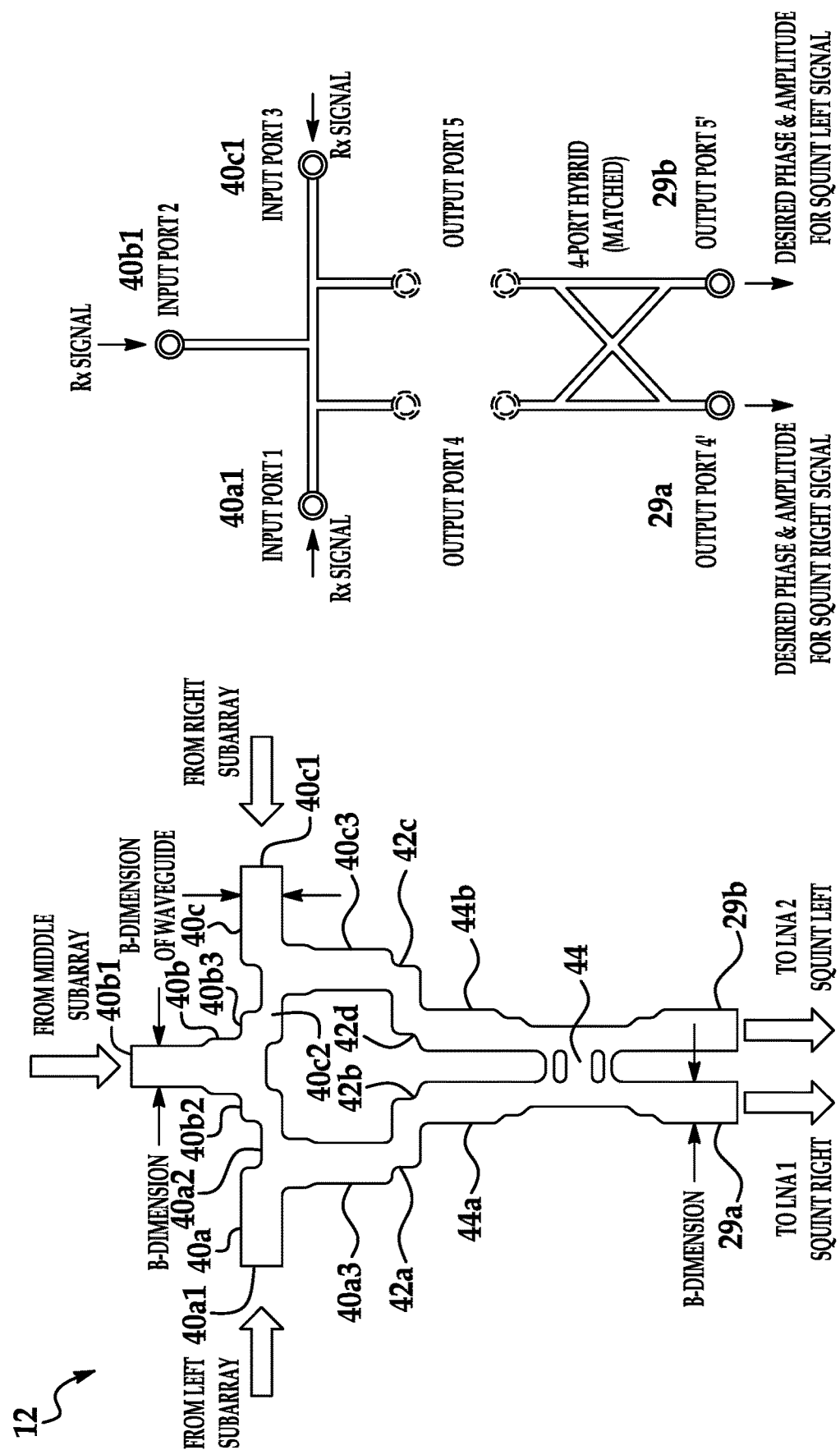

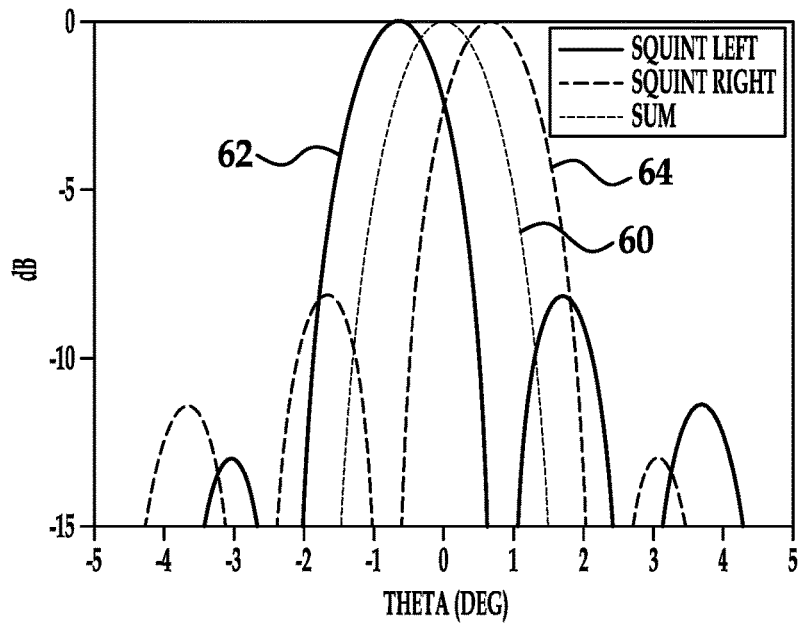
FIG. 5A
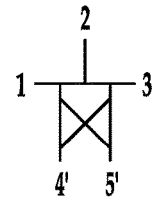
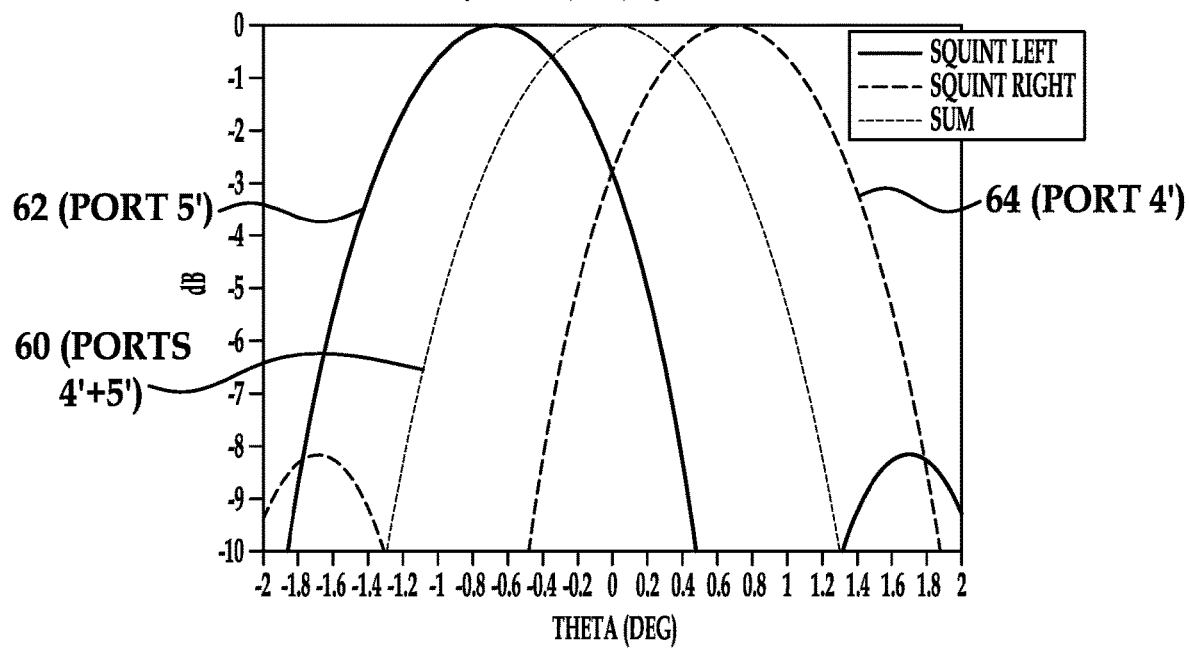
FIG. 5B

LOSSLESS LOBING CIRCUIT FOR MULTI-SUBARRAY TRACKING

TECHNICAL FIELD

The present invention relates generally to antennas and, more particularly, to a lossless reactive lobing circuit for multi-subarray tracking antenna systems.

BACKGROUND ART

A high "aspect ratio" antenna has a beamwidth in the plane of an axis in a long dimension of the aperture that is substantially narrower than the beamwidth in the plane of the axis in a short dimension of the aperture. As a result, the antenna positioner (gimbal axis) responsible for pointing the antenna in this plane will exhibit greater sensitivity to high rate angular motions of the vehicle. As a consequence, highly accurate (and typically expensive) inertial measuring electronics are often employed to enable open-loop pointing of the antenna subsystem as a means to ensure the peak of the beam is always pointed at the intended target.

For mechanically steered antenna systems, particularly those that are mounted on moving vehicles lacking sophisticated inertial measurement devices, a means for regularly verifying and optimizing a pointing direction of the antenna is required to ensure the device is maintaining an effective communication link or target track. Many 2-D gimbal-based antenna systems rely on periodic movement of the antenna and a measured power level of a signal received from a target as a means for optimizing pointing of the system towards the target (commonly known as mechanical dithering or lobing/squinting). In communication systems, received signal strength indication (RSSI) is a means of implementing mechanical dithering and is typically achieved by steering the antenna away from the last known location of the target by small amounts, typically 10-20% of a beamwidth, at a periodic rate typically in the range of 0.5 to 2 Hz. A detection then is performed of the radio frequency (RF) or intermediate frequency (IF) signal level received from the target at predetermined measurement points throughout the motion profile. From this information, an optimum location of the target can be accurately estimated, with equal power levels detected at each measurement point equidistant from the last known target center representing an antenna that is optimally pointed.

While RSSI has proven to be an affordable and effective method of accurately pointing numerous types of mechanically steered (two-axis or three-axis gimbal-based) on-the-move and on-the-pause antenna systems, frequent exercise of bearings, motors, and other motion hardware necessary to optimize pointing of the antenna towards the intended target (e.g., satellite) can significantly increase the wear and tear on such motion hardware. This repeated motion can shorten the life of the overall system and/or increase the frequency at which maintenance must be performed. In addition, the associated signal/gain loss due to the intentional periodic mis-pointing reduces overall system performance (receive gain). Further, in the case of systems employing both transmit and receive functions via a common shared antenna aperture, it is often necessary to disable or mute the transmit function to prevent undesired interference with adjacent satellites (associated with the intentional periodic movement of the transmit beam position in concert with the receive beam).

One electronic method for performing antenna lobing/squinting is through the utilization of a Butler Matrix array. However, a Butler Matrix is complex in construction, difficult to package, and struggles with pointing the antenna beam to broadside. A simpler electronic method wherein the aperture is sub-divided into two halves and combined via a 4-port magic-tee, hybrid, or similar coupler, suffers from undesirable elevated sidelobes and non-ideal beam offsets (associated with the fixed, coarse nature of the two-halve aperture partitioning).

In view of the above shortcomings, there is a need in the art for a low-cost, highly reliable alternative to providing accurate antenna pointing while in motion.

SUMMARY OF INVENTION

A system and method in accordance with the present invention provide a low-loss, low-cost method of "electronic dithering" (lobing) of the antenna beam in lieu of mechanical dithering, thereby reducing wear and tear on the system. More specifically, instead of mechanically dithering an antenna-mounted gimbal/positioner and utilizing RSSI, a lobing circuit and method in accordance with the invention enable electronic dithering, resulting in little or no mechanical movement yet achieving the same result. When integrated with other common RF electronics, the lobing circuit, in lieu of mechanical dithering and avoiding the undesired receive loss and transmit pointing errors thereto, enables a low-loss, low-cost electronic method of optimizing antenna pointing in one or more planes, providing superior beam control and sidelobe characteristics via three-subarray aperture partitioning compared to conventional two-subarray electronic approaches.

According to one aspect of the invention, a multiport microwave device includes: a first reactive three-port microwave device; a second reactive three-port microwave device; a third reactive three-port microwave device; and a matched four-port microwave device having first and second input ports and first and second output ports communicatively coupled to one another. A first port of each of the first, second and third three-port microwave devices is operative to receive a microwave signal, and a first output port and a second output port of the four-port microwave device are each operative to output a microwave signal, a second port of the first microwave device is communicatively coupled to a second port of the second microwave device, and a second port of the third microwave device is communicatively coupled to a third port of the second microwave device. A third port of the first microwave device is communicatively coupled to the first input port the four-port microwave device, and a third port of the third microwave device is communicatively coupled to the second input port of the four-port microwave device.

In one embodiment, two distinctly different phase and amplitude relationships between the first port of each of the first, second, and third reactive microwave devices is collectively received at each of the first and second input ports of the four-port microwave device.

In one embodiment, the device includes first, second and third subarrays arranged along a common plane, wherein the first port of the first, second, and third reactive microwave devices are individually attached to the first, second and third subarrays, respectively.

In one embodiment, a microwave signal received by each of the first, second and third subarrays is combined by the first, second and third microwave devices, and two distinctly different microwave signals are output from each of the first and second output ports of the four-port microwave device, the output signals corresponding to two different anti-symmetric antenna pattern responses.

In one embodiment, each of the microwave signals emanating from the first and second output ports of the four-port microwave device are coherently combined together to attain a symmetric antenna pattern gain response.

In one embodiment, the device includes: a first compensation circuit connected to the first output port of the four-port microwave device; a second compensation circuit connected to the second output port of the four-port microwave device, wherein the first and second compensation circuits are configured to tune a phase and amplitude of a microwave signal output by the first and second output ports of the four-port microwave device.

In one embodiment, each compensation circuit comprises one of a low-noise amplifier or a low noise block-downconverter.

In one embodiment, operational characteristics of the low noise amplifier or the low noise block-downconverter of the first compensation circuit are electrically matched to operational characteristics of the low noise amplifier or low noise block-downconverter of the second compensation circuit.

In one embodiment, each compensation circuit comprises a variable attenuator circuit and a variable phase trim circuit.

In one embodiment, the first input port and the second input port of the matched four-port microwave device are connected to the first output port and the second output port, respectively, via a directed connection, and the first input port and the second input port are indirectly connected to the second output port and the first output port, respectively, via a cross connection.

In one embodiment, the device includes a switching circuit including a first input, a second input, a third input, and an output, the switching circuit operative to selectively couple one of the first, second or third inputs to the output, wherein the first input is electrically connected to an output of the first compensation circuit, the second input is electrically connected to an output of both the first and second compensation circuits, and the third input is electrically connected to an output of the second compensation circuit.

In one embodiment, the three-port microwave devices each comprise an E-plane Waveguide Tee, and the four-port microwave device comprises an E-plane waveguide hybrid.

In one embodiment, the device includes a plurality of E-Bends connected between the E-plane Waveguide Tee devices and the E-plane waveguide hybrid.

In one embodiment, the antenna comprises a 3×3 matrix of subarrays and a plurality of devices according to claims 1-14 are employed.

According to another aspect of the invention, a method of electronically dithering a signal received by an antenna array having first, second and third subarrays arranged in a single row is provided. The method includes: using reactive three-port microwave devices to combine signals received from each of the first, second and third subarrays; splitting, via a matched four-port microwave device, the combined signals into a first signal component and a second signal component different from the first signal component; and selectively recombining the split signals to produce an antenna beam that is oriented left, oriented broadside, or oriented right.

In one embodiment, selectively recombining the split signals includes providing the first and second signal components to first and second inputs, respectively, of a matched four-port microwave device, and selectively switching between first and second outputs of the matched four-port microwave device to produce the left, broadside or right orientation of the antenna beam.

In one embodiment, the method includes matching, in amplitude and phase, the first signal component to the second signal component.

In one embodiment, the method includes measuring a received microwave signal at the first signal component, measuring a received microwave signal at the second signal component and adjusting the pointing of the antenna based on the difference between the two measured signals when the difference exceeds a predetermined threshold.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, like references indicate like parts or features.

FIG. 3A illustrates an exemplary lobing circuit in accordance with the invention.

FIG. 3B is a schematic diagram of the port assignment for the lobing circuit of FIG. 3A.

FIGS. 5A, 5B and 5C are graphs showing azimuth receive patterns at 20.2 GHz, where a dithering network provides a one-beamwidth beam separation between left and right beams.

DETAILED DESCRIPTION OF INVENTION

Existing technology for accurate antenna pointing of mechanically-scanned antenna systems typically requires either 1) procuring expensive inertial measurement electronics to accurately sense vehicle motion, 2) employing a Butler Matrix array to steer the antenna beam electronically, or 3) physically steering the antenna away from the desired target to confirm that the beam is centered. The first two approaches are complex and costly with little improvement in pointing accuracy and agility, while the third approach has reliability/life limitations if used as the sole or primary means of pointing optimization and suffers from receive and transmit gain roll-off and undesirable mis-pointing of the transmit beam.

A device and method in accordance with the present invention eliminate the need to mechanically steer (dither) the antenna in the lobing plane at a high rate. Moreover, the device and method in accordance with the invention reduce the need to procure expensive inertial measuring electronics to ensure the antenna is properly pointed at the desired target while on-the-move. This results in an optimal combination of cost, performance, and system reliability.

Figure 1:
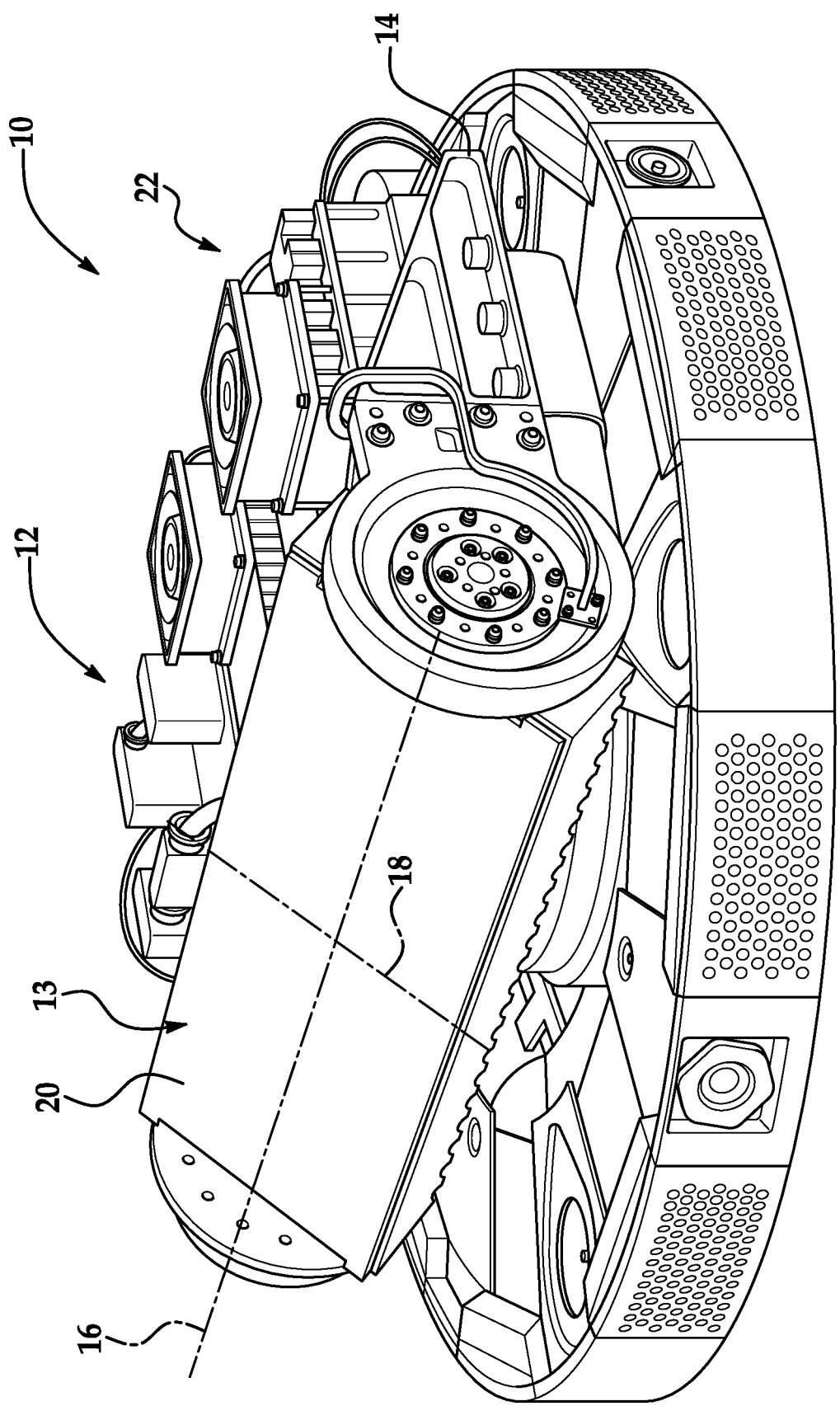
FIG. 1 is a perspective view of an exemplary high-aspect ratio antenna array on a two-axis gimbal positioner

Referring to FIG. 1, an exemplary vehicle-mounted two-axis gimballed antenna system 10 employing a lobing circuit 12 in accordance with the invention is illustrated. The antenna system 10 includes an array 13 (aperture) mounted to a frame 14, the array having dimensions that are generally rectangular or elliptical in shape, whereby a dimension along one axis 16 (azimuth) of the array 13 is substantially longer than a dimension along the other axis 18 (elevation). In the embodiment of FIG. 1, the apertures are arranged behind a polarizer 20 and thus not seen. Motion hardware 22 that includes electronics and motors control the motion of the azimuth and elevation of the array 13.

Figures 2A, 2B:
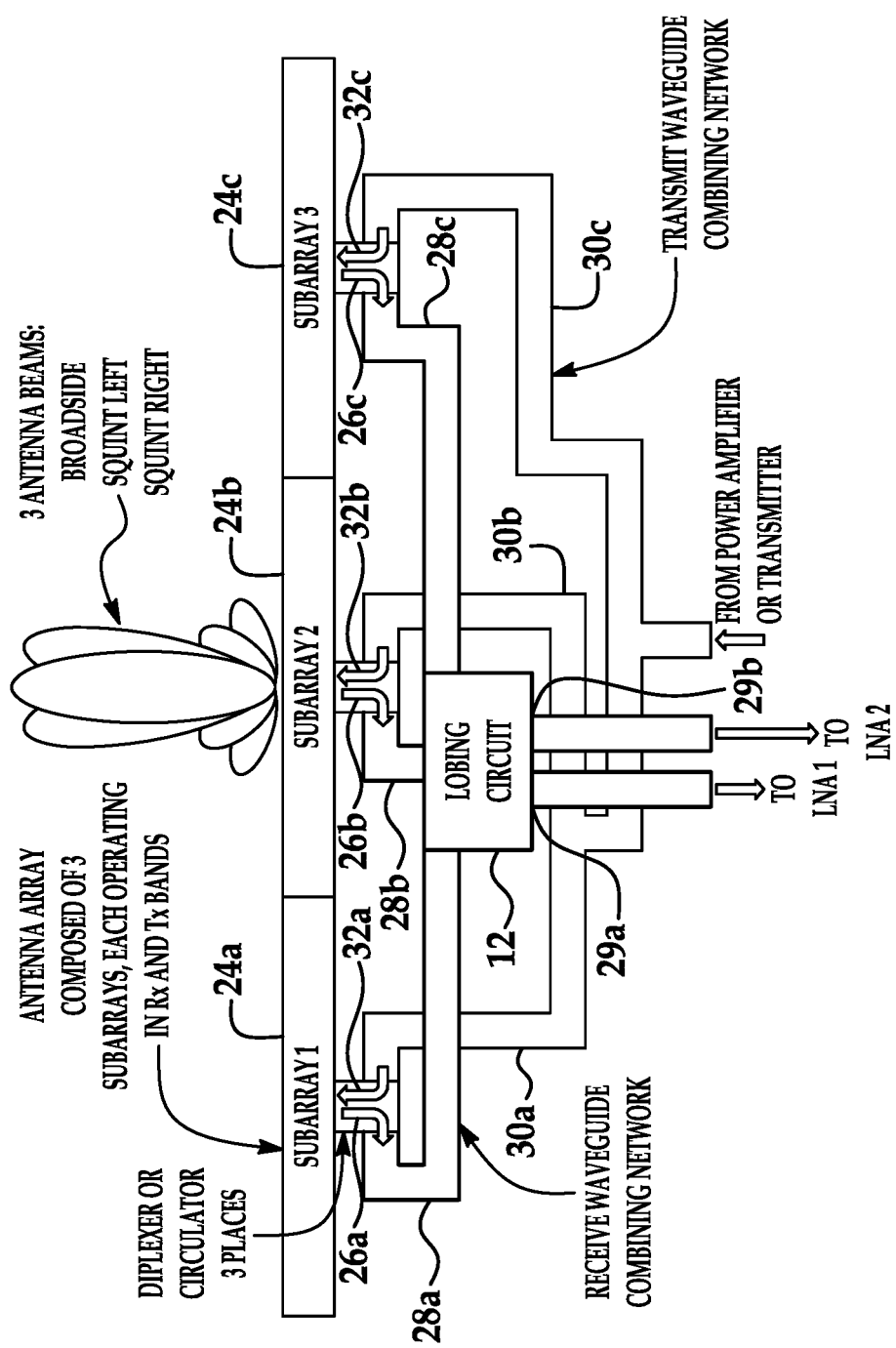
FIG. 2A is a schematic diagram of a planar array antenna architecture using a lobing circuit in accordance with the invention.
FIG. 2B is a side view of the antenna of FIG. 2A.

With additional reference to FIGS. 2A and 2B, in such an embodiment it is possible to subdivide the antenna aperture 13 into three subarrays 24a, 24b and 24c (also referred to as antenna radiating elements) in the long dimension of the array (along axis 16). A receive port 26a, 26b, 26c of each subarray 24a, 24b, 24c may be connected to the lobing circuit 12 in accordance with the invention via combining network parts 28a, 28b, 28c (e.g., waveguides, microstrips, or the like). Additionally, two output ports 29a, 29b of the lobing circuit 12 may be connected to two RF-matched compensation circuits for tuning a phase and amplitude of the signal received from the respective ports 29a, 29b. As discussed below, the compensation circuits each may include LNAs (Low Noise Amplifiers) or LNBs (Low Noise Block-downconverters), and other related RF electronics. While subsequent description of the invention will refer to LNAs, it should be appreciated that the LNAs can be replaced with LNBs or like devices. As shown in FIG. 2, the three-subarray antenna architecture also has a separate combining network 30a, 30b and 30c (e.g., waveguides, microstrips, or the like) supporting a transmit path, each combining network 30a, 30b, 30c connected to a transmit port 32a, 32b, 32c of each subarray 24a, 24b, 24c. In lieu of using 3 subarrays of the same integrated antenna aperture, it is also possible to achieve similar results when 3 separate, yet adjacent antennas (e.g. dishes, horns, etc.) are combined in a similar fashion.

Accordingly, the exemplary lobing circuit 12 comprises a three-input/two-output device (a five-port device). When integrated with an antenna sectorized into three subarrays 24a, 24b, 24c, two low noise amplifiers (LNAs), and other related RF components in the receive path of the mechanically steered antenna, the lobing circuit 12 can electronically squint the receive beam of the antenna to the left, right, or broadside relative to antenna normal by a pre-determined amount. Such squinting of the antenna beam in more than one direction is also referred to as lobing, and in accordance with the present invention, provides a low-cost method to optimize on-the-move communications antenna pointing in at least one directional plane.

In one embodiment, a portion of the lobing circuit 12 in accordance with the invention can be comprised solely of low-loss waveguide components that can be integrated together into a relatively simple two-piece construction. In another embodiment, a portion of the lobing circuit 12 can include microstrip transmission lines.

With reference to FIG. 3A, illustrated is a top view of one embodiment of a passive lobing circuit 12 employing low-loss waveguide components. The exemplary lobing circuit 12 of FIG. 3A includes a first reactive three-port microwave device 40a, a second reactive three-port microwave device 40b, and a third reactive three-port microwave device 40c. The first, second and third reactive three-port microwave devices may be lossless three-port devices. As used herein, a reactive microwave device is a device in which one or more of the three ports of the device are not matched, thus causing signal reflections which should then be accommodated in the larger circuit. Use of reactive components in antenna systems is counterintuitive as the reflections caused by reactive components (e.g., a signal communicated by one port to another port will be at least partially reflected back to that receiving port) is generally considered undesirable in antenna systems. However, the device in accordance with the present invention advantageously exploits the reactive nature of these components (and the reflections created by them) to create a "lossless" electronic dithering function for an antenna system. This would otherwise not be possible if conventional matched 4-port devices were to be solely employed in the circuit.

The lobing circuit 12 further includes a matched (non-reactive) four-port microwave device 44 having first and second input ports 44a, 44b and first and second output ports 29a, 29b communicatively coupled to one another. The four-port microwave device 44 may be a hybrid device having both summing and differential ports that produce different phasing between ports. Since the ports of the four-port device are matched, signal reflection between ports is minimal or non-existent.

A first port 40a1, 40b1, 40c1 of each of the first, second and third three-port microwave devices 40a, 40b, 40c is operative to receive a microwave signal, and the first output port 29a and the second output port 29b of the four-port microwave device 44 are each operative to output a microwave signal corresponding to a combination of the signals received by the first ports 40a1, 40b1, 40c1. A second port 40a2 of the first microwave device 40a is communicatively coupled to a second port 40b2 of the second microwave device 40b, and a second port 40c2 of the third microwave device 40c is communicatively coupled to a third port 40b3 of the second microwave device 40b. A third port 40a3 of the first microwave device 40a is communicatively coupled to the first input port 44a of the four-port microwave device 44, and a third port 40c3 of the third microwave device 40c is communicatively coupled to the second input port 44b of the four-port microwave device 44.

In the exemplary embodiment, the first, second and third three-port devices 40a, 40b, 40c may be three three-port waveguide E-plane T's, and the four-port device 44 may be an E-plane waveguide 90° Hybrid. Four E-Bends 42a, 42b, 42c, 42d connect the three-port devices 40a, 40b, 40c to the E-plane waveguide 90° Hybrid. The device of FIG. 3A provides the combining/splitting/recombining of the signals from each of the three antenna subarrays 24a, 24b, 24c to present the desired phase and amplitude to the two LNAs in the receive path.

In the specific case of the E-plane waveguide 90° Hybrid, two parallel waveguide sections are interconnected via two or more apertures (interconnecting waveguide sections) bridging between their opposing waveguide broadwalls. The lengths, spacing, and heights of these interconnecting sections or apertures are chosen in order to provide for cancellation of their respective reflections such that all four ports of the Hybrid are "matched" and to provide for a net coupling of power, via the interconnecting sections, of 50% of the power from one "input" waveguide to the adjacent "coupled" waveguide. Owing to its two-plane physical symmetry, all 4 individual ports of the Hybrid device have identical microwave coupling characteristics relative to the other three ports and due to "unitary conditions", the phase of the "coupled" power in the adjacent (coupled) waveguide relative to the phase of the "uncoupled" power in the input waveguide is 90°.

The E-plane waveguide bends 42a, 42b, 42c, and 42d are representative of a broad class of two-port microwave devices wherein microwave energy traveling in one direction is re-directed ("bent") to a second direction roughly orthogonal to the first direction. In the specific case of an "E-plane" waveguide bend, this 90° redirection is geometrically in the Electric ("E") field plane of the rectangular waveguide. Non-uniform protrusions from the broadwall of the interconnecting waveguides are generally employed in these devices in order to ensure good RF matching (low reflection) properties.

As an interconnected 5-port structure comprised of reactive 3-port devices, an isolated microwave signal individually entering any one of the three input ports 40a, 40b, or 40c is (undesirably) coupled/leaked to each of the other two input ports as well as (desirably) coupled to each of the two output ports (input ports to the Hybrid) 44a and 44b. In addition, all three of the input ports are individually not well matched (i.e. they are reflective.) However, through the preferred selection of the physical spacing, interconnection, and coupling details of the individual three-port devices comprising the structure, favorable constructive and destructive interference within the composite 5-port structure, when signals (simultaneous received energy from each of the three subarrays) are simultaneously introduced to all three input ports 40a, 40b, and 40c, results in the desired microwave characteristics. Specifically, output ports 44a and 44b are well-matched; the net reflections (the super-position of isolated reflection of any one of the 3-port devices plus the leaked/coupled signal from the other two input ports) destructively cancel such that input ports 40a, 40b, and 40c are effectively matched; received far-field "antenna" energy from the Left, Middle, and Right Subarrays when incident at the angle of the "left/right lobe" constructively add at output ports 44b/44a; and destructively add (cancel) at output ports 44a/44b.

The first port 40a1, 40b1, 40c1 of the first, second, and third reactive microwave devices can each be individually attached to the first, second and third subarrays 24a, 24b, 24c, respectively, of the antenna. A microwave signal received by each of the first, second and third subarrays 24a, 24b, 24c is combined by the first, second and third microwave devices 40a, 40b, 40c, where the received signals can have at least two distinctly different phase and amplitude relationships between the first port 40a1, 40b1, 40c1. The combined signals are collectively received at each of the first and second input ports 44a, 44b of the four-port microwave device 44, and two distinctly different microwave signals are output from each of the first and second output ports 29a, 29b of the four-port microwave device 44. More particularly, each of the microwave signals emanating from the first and second output ports 29a, 29b of the four-port microwave device 44 may be coherently combined together to attain a symmetric antenna pattern gain response, where each of the two combined signals correspond to two different anti-symmetric antenna pattern responses.

With additional reference to FIG. 3B, the lobing circuit 12 of FIG. 3A is shown schematically along with port assignments. Specifically, the lobing circuit 12 is divided into three sections, an input section (input ports 1, 2 and 3), an intermediate section (output ports 4 and 5) and an output section (output ports 4' and 5'). Performance characteristics of the lobing circuit are discussed below with respect to the port assignments shown in FIG. 3B.

Figure 4:
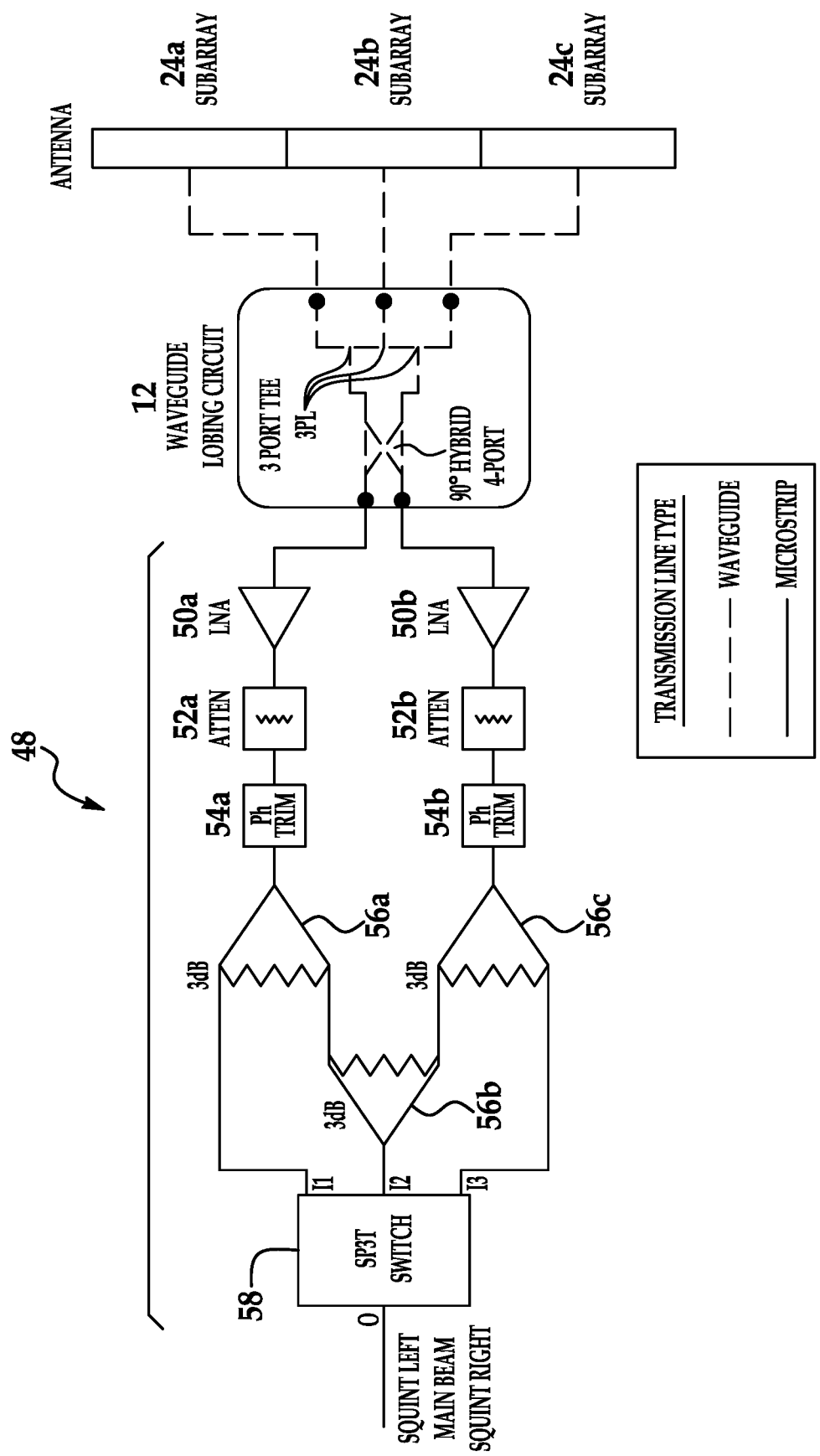
FIG. 4 is a schematic diagram of an antenna system that utilizes a lobing circuit in accordance with the invention.

With additional reference to FIG. 4, illustrated is a block diagram of a lobing circuit 12 and associated circuitry in accordance with the invention. In particular, FIG. 4 illustrates exemplary architecture of the antenna system 10 of FIG. 1, including implementation of the lobing circuit 12 within the three-subarray antenna architecture 24a, 24b, 24c. "Back-end" RF electronics are provided to support the electronic lobing function. The back-end RF electronics, which are coupled to respective output ports 29a, 29b of the four-port device 44, include a two-port low-noise amplifier circuit (lobing network 48) that can switch between the two output ports 29a, 29b of the lobing circuit 12, as well as have both ports 29a, 29b selected at the same time.

The low-noise amplifier circuit 48 includes first and second LNAs 50a, 50b each coupled to a respective output 29a, 29b of the lobing circuit 12. The two LNAs 50a, 50b are preferably closely matched in amplitude and phase to one another to ensure equal signal strength and phase is achieved when the antenna is accurately pointed. The output of each LNA 50a, 50b is connected to a variable attenuator 52a, 52b, which is operative to balance the amplitude of the signal from each LNA. The output of each attenuator 52a, 52b is connected to a respective variable phase trim circuit 54a, 54b. A purpose of the variable attenuators 52a, 52b and the variable phase trim circuits 54a, 54b is to adjust the respective output signals from the lobing circuit 12 as provided by each LNA 50a, 50b so that operational characteristics (e.g., amplitude and phase) of one LNA are matched to those of the other LNA. The LNA 50a, attenuator 52a, and phase trim circuit 54a form a first compensation circuit, while the LNA 50b, attenuator 52b, and phase trim circuit 54b form a second compensation circuit. The first and second compensation circuits are configured to tune a phase and amplitude of a microwave signal output by the first and second output ports 29a, 29b of the hybrid microwave device. Although typically performed in microstrip, other transmission line media are possible for effecting the low-noise amplifier circuit 48.

The output of each phase trim circuit 54a, 54b is connected to the input terminal of a power divider 56a, 56b, such as a Wilkerson power divider. One output power terminal of each power divider 56a, 56b is connected directly to switch 58, while the other output power terminal of each power divider 56a, 56b is connected to a respective input power terminal of a power combiner 56c. The output power terminal of the power combiner 56c is also connected to switch 58.

In operation, the signal received from each subarray 24a, 24b, 24c is provided to the lobing circuit 12, which combines/splits/recombines the received signals and provides the signal(s) to the LNAs 50a, 50b connected to the respective outputs 29a, 29b of the lobing circuit 12. The respective LNAs 50a, 50b, attenuators 52a, 52b and phase trim circuits 54a, 54b amplify and match the two signals, and then provide the signals to the power dividers 56a, 56b, and power combiner 56c and subsequently to the single-pole triple-throw switch (SP3T) 58. When the switch 58 is cycled through its three states, the single output port "O" of the switch 58 will provide a signal for each of the three different beams. More particularly, a signal for a beam that is squinted to the left of the main beam (I1), a signal for the un-squinted and centered main beam (I2), and a signal for a beam squinted to the right of the main beam (I3) are each provided to the circuitry.

A squint angle of the left and right beams as measured from the centered main beam (broadside, i.e., the principle direction of radiation is perpendicular to the array axis and in the plane containing the array element) depends on frequency of operation and subarray size. The angle is typically in the range of one or two degrees and is the same, fixed angle for both beams, with very little variation over frequency. On this basis, if the antenna is mis-pointed relative to the end target, the signal strength coming from the target measured at each LNA 50*a*, 50*b* port will be different, providing an indication of the direction and angle that readjustment of the pointing direction of the antenna is required. Further, since the slopes of the squinted beams are well-behaved and predictable (see FIGS. 5-6D), it is relatively straightforward to deterministically calculate the measured pointing correction required based on the differential signal strength measured at both ports. For instance, an antenna mis-pointed by 0.2° in FIG. 5B would result in one port measuring 3 dB less power than the other port.

Cycling the switch 58 at a relatively high rate provides the ability to continuously optimize or confirm pointing of the antenna. On this basis, mechanical movement of the gimbal positioner in the lobing plane of the antenna is only required in instances in which the differential signal strength of the two lobing signals exceeds a predetermined threshold amount. As soon as the left and right squint signals are measured to have the same power level or the differential amount is under the threshold, then the antenna can be assumed to be accurately pointed in that plane. As compared to mechanical dithering, electronic lobing in accordance with the invention is faster and does not rely on mechanical movement, minimizing the wear and tear on gimbal/positioner hardware.

Figure 5C:
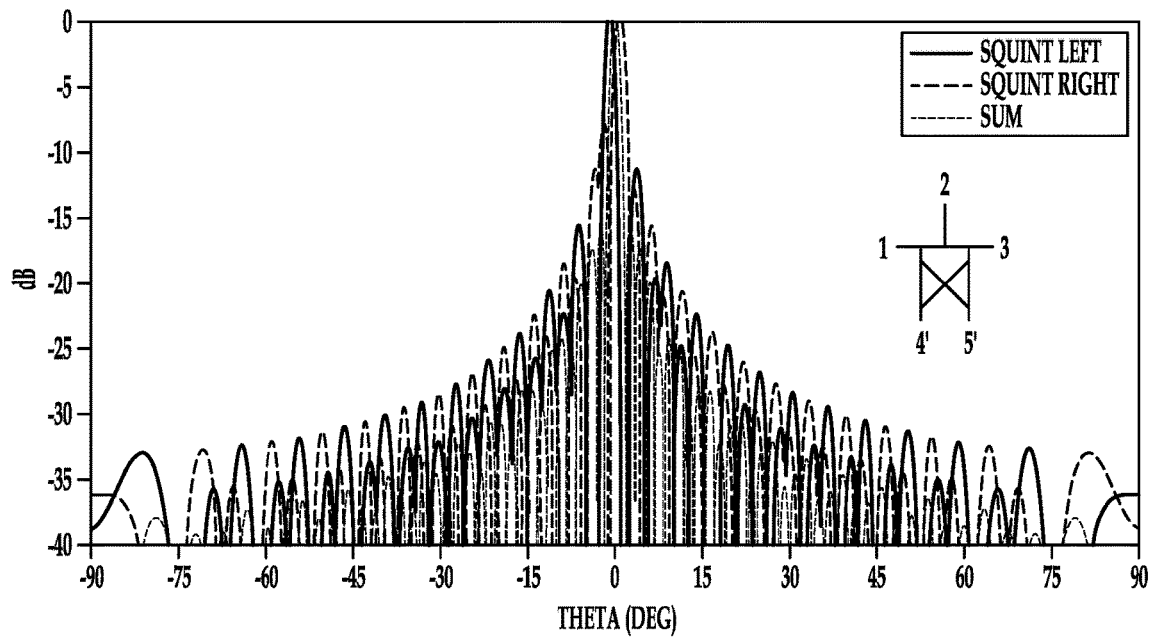

Referring now to FIGS. 5A-6D, illustrated are graphs showing the performance the lobing circuit 12 in accordance with the present invention. More specifically, FIGS. 5A-5C illustrate theoretical antenna receive patterns at a particular frequency, FIG. 5B showing a zoomed view and FIG. 5C showing an expanded view. As can be seen from the figures, the sum 60 of the two signals (the sum of ports 4 and 5) from the lobing circuit outputs 29*a*, 29*b* has a peak at 0 degrees (relative to the mechanical normal of the antenna aperture). In contrast, the squint left signal 62 (port 4—i.e., the signal from the output 29*a* of the lobing circuit 12) has its peak at about −0.7 degrees (i.e., shifted to the left of the summed signal 60), while the squint right signal 64 (port 5—i.e., the signal from the output 29*b* of the lobing circuit 12) has its peak at about 0.7 degrees (i.e., shifted to the right relative to the summed signal 60). Thus, the lobing circuit 12 can provide a beam separation of 1.4 degrees between the left and right beams.

The one beamwidth beam separation between the left and right beams (meaning ½ beamwidth left and ½ beamwidth right) is very close to an ideal compromise between maximum angular span and minimum gain roll-off at the crossover point. Not only does the Sum antenna pattern demonstrate low sidelobe performance as indicated in FIG. 5C, but the squinted antenna patterns show similarly low sidelobes, as well. Such favorable sidelobe behavior cannot be achieved using traditional two-subarray lobing techniques.

Figure 6A:
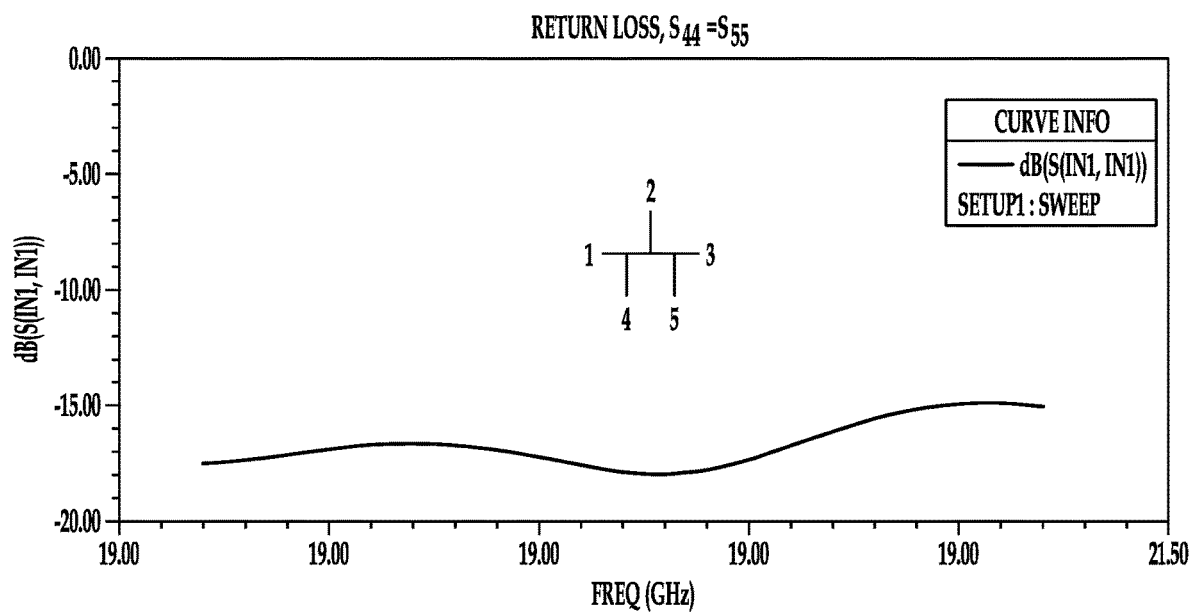
FIG. 6A is a graph showing return loss for an exemplary lobing circuit with the 4-port device removed in accordance with the invention.
Figure 6B:
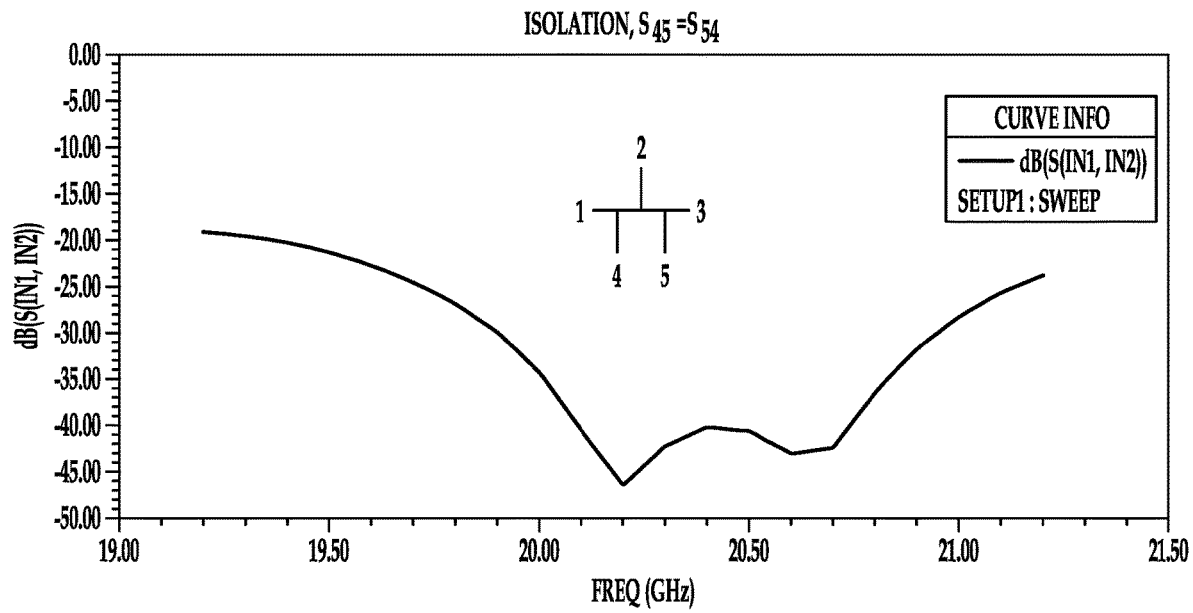
FIG. 6B is a graph showing isolation for an exemplary lobing circuit with the 4-port device removed in accordance with the invention.
Figure 6C:
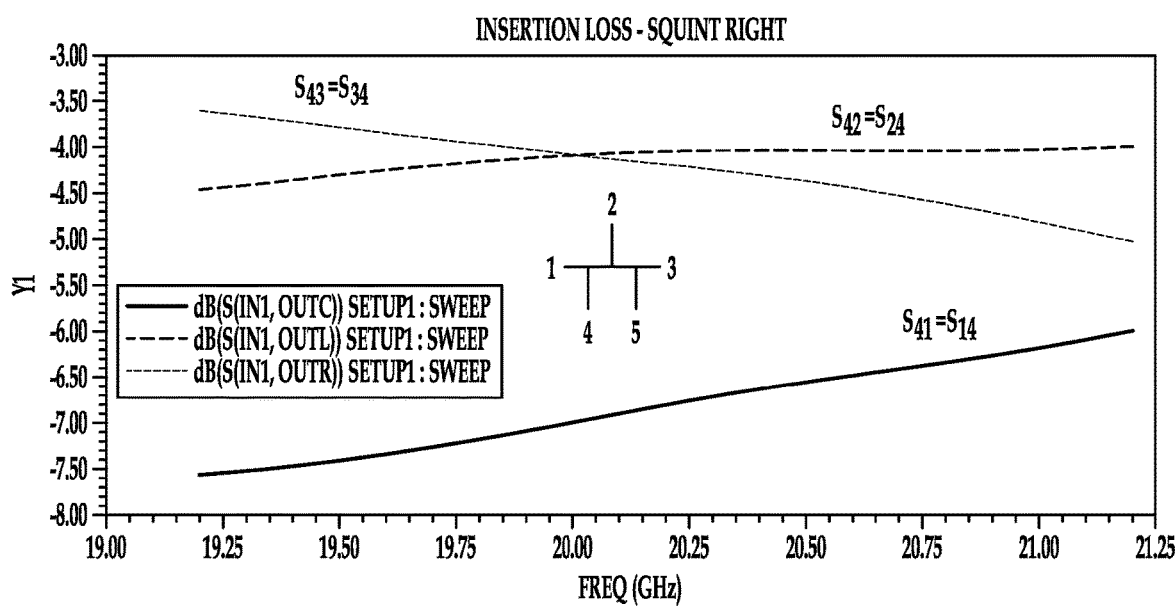
FIG. 6C is a graph showing left-squint for an exemplary lobing circuit with the 4-port device removed in accordance with the invention.
Figure 6D:
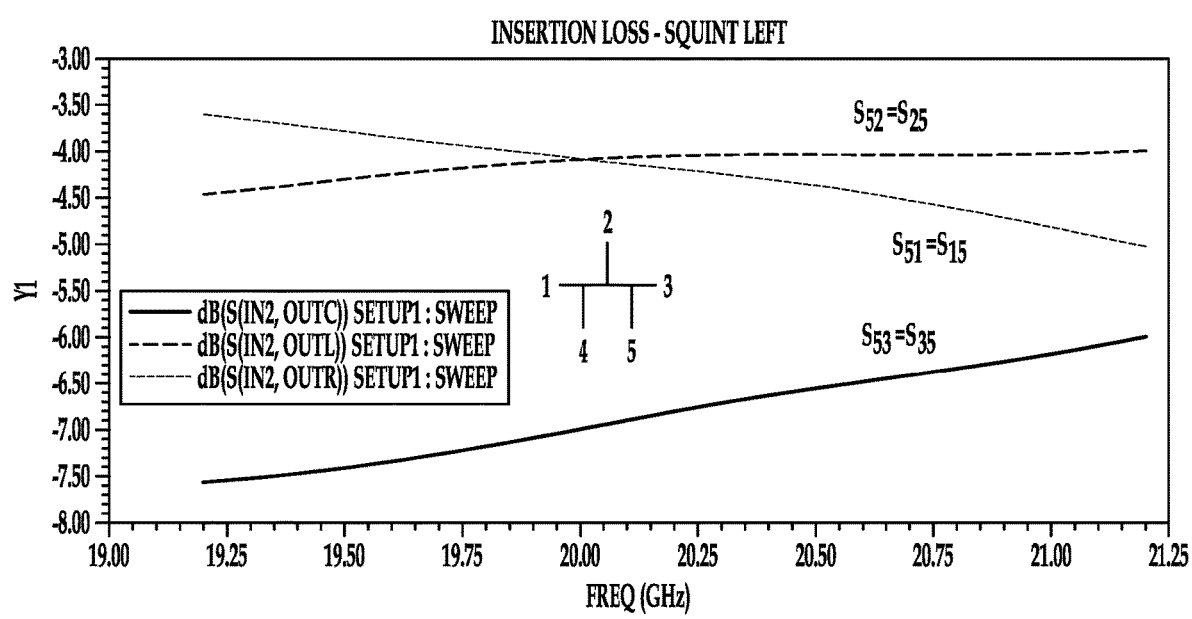
FIG. 6D is a graph showing right-squint for an exemplary lobing circuit with the 4-port device removed in accordance with the invention.

FIGS. 6A-6D illustrate S-parameter results when the lobing circuit without the 4-port hybrid is measured on a standalone basis (without antenna and lobing network attached). Specifically, FIG. 6A illustrates the return loss for $S_{44}=S_{55}$, while FIG. 6B illustrates the isolation for $S_{45}=S_{54}$. FIGS. 6C and 6D illustrate the insertion loss (relative power division) performance for squint right and squint left, respectively.

Key design considerations for the composite lobing circuit include: relative coupling magnitudes (generally center-weighted/tapered in order to minimize both "sum" and "squinted" pattern sidelobes) and relative coupling phases (a fixed subarray-to-subarray phase offset in order to provide the desired beam-squint offset angles) between the 3 subarrays; minimum reflections at each of the two individual output ports; and minimum coupling (maximum isolation) between the two individual output ports.

Given an identical optimized starting design for each of the constituent three-port reactive tee components (with equal power-division between the input arm and each of the two collinear output arms, with the input port well-matched), the physical spacing between the centerline of each of the outboard reactive tees relative to the centered inboard tee is varied in order to provide a balanced compromise between good matching (minimized reflections) at each of the two output ports and maximum isolation (minimum coupling) between the two output ports. The relative phase from the each of the two output arms between the center input port and the adjacent outboard port is adjusted for balanced (identical) phase via adjustment of the phase reference (insertion of additional waveguide) at the adjacent outboard input port. As a final step, small perturbations (incorporation of added tuning features) to the collinear arms of the two outboard reactive three-port tees is employed to further enhance the output arm match and isolation characteristics.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

What is claimed is:

1. A multiport microwave device, comprising:
    a first reactive three-port microwave device;
    a second reactive three-port microwave device;
    a third reactive three-port microwave device; and
    a matched four-port microwave device having first and second input ports and first and second output ports communicatively coupled to one another,
    wherein a first port of each of the first, second and third three-port microwave devices is operative to receive a microwave signal, and a first output port and a second output port of the four-port microwave device are each operative to output a microwave signal, a second port of the first microwave device is communicatively coupled to a second port of the second microwave device, a second port of the third microwave device is communicatively coupled to a third port of the second microwave device, a third port of the first microwave device is communicatively coupled to the first input port the four-port microwave device, and a third port of the third microwave device is communicatively coupled to the second input port of the four-port microwave device.

2. The microwave device according to claim 1, wherein two distinctly different phase and amplitude relationships between the first port of each of the first, second, and third reactive microwave devices is collectively received at each of the first and second input ports of the four-port microwave device.

3. The device according to claim 1, further comprising first, second and third subarrays arranged along a common plane, wherein the first port of the first, second, and third reactive microwave devices are individually attached to the first, second and third subarrays, respectively.

4. The device according to claim 3, wherein a microwave signal received by each of the first, second and third subarrays is combined by the first, second and third microwave devices, and two distinctly different microwave signals are output from each of the first and second output ports of the four-port microwave device, the output signals corresponding to two different anti-symmetric antenna pattern responses.

5. The device according to claim 4, wherein each of the microwave signals emanating from the first and second output ports of the four-port microwave device are coherently combined together to attain a symmetric antenna pattern gain response.

6. The device according to claim 1, further comprising:
a first compensation circuit connected to the first output port of the four-port microwave device;
a second compensation circuit connected to the second output port of the four-port microwave device,
wherein the first and second compensation circuits are configured to tune a phase and amplitude of a microwave signal output by the first and second output ports of the four-port microwave device.

7. The device according to claim 6, wherein each compensation circuit comprises one of a low-noise amplifier or a low noise block-downconverter.

8. The device according to claim 7, wherein operational characteristics of the low noise amplifier or the low noise block-downconverter of the first compensation circuit are electrically matched to operational characteristics of the low noise amplifier or low noise block-downconverter of the second compensation circuit.

9. The device according to claim 6, wherein each compensation circuit comprises a variable attenuator circuit and a variable phase trim circuit.

10. The device according to claim 1, wherein the first input port and the second input port of the matched four-port microwave device are connected to the first output port and the second output port, respectively, via a directed connection, and the first input port and the second input port are indirectly connected to the second output port and the first output port, respectively, via a cross connection.

11. The device according to claim 1, further comprising a switching circuit including a first input, a second input, a third input, and an output, the switching circuit operative to selectively couple one of the first, second or third inputs to the output, wherein the first input is electrically connected to an output of the first compensation circuit, the second input is electrically connected to an output of both the first and second compensation circuits, and the third input is electrically connected to an output of the second compensation circuit.

12. The device according to claim 1, wherein the three-port microwave devices each comprise an E-plane Waveguide Tee, and the four-port microwave device comprises an E-plane waveguide hybrid.

13. The device according to claim 12, further comprising a plurality of E-Bends connected between the E-plane Waveguide Tee devices and the E-plane waveguide hybrid.

14. The device according to claim 3, wherein the antenna comprises a 3×3 matrix of subarrays and a plurality of devices according to claim 1 are operatively coupled to the antenna.

15. A method for electronically dithering a signal received by an antenna array having first, second and third subarrays arranged in a single row, the method comprising:
using reactive three-port microwave devices to combine signals received from each of the first, second and third subarrays;
splitting, via a matched four-port microwave device, the combined signals into a first signal component and a second signal component different from the first signal component; and
selectively recombining the split signals to produce an antenna beam that is oriented left, oriented broadside, or oriented right.

16. The method according to claim 15, wherein selectively recombining the split signals includes providing the first and second signal components to first and second inputs, respectively, of a matched four-port microwave device, and selectively switching between first and second outputs of the matched four-port microwave device to produce the left, broadside or right orientation of the antenna beam.

17. The method according to claim 15, further comprising matching, in amplitude and phase, the first signal component to the second signal component.

18. The method according to claim 15, further comprising measuring a received microwave signal at the first signal component, measuring a received microwave signal at the second signal component and adjusting the pointing of the antenna based on the difference between the two measured signals when the difference exceeds a predetermined threshold.

* * * * *